(12) United States Patent
Imoto

(10) Patent No.: US 6,902,992 B2
(45) Date of Patent: Jun. 7, 2005

(54) METHOD OF FABRICATING SEMICONDUCTOR DEVICE HAVING SEMICONDUCTOR RESISTANCE ELEMENT

(75) Inventor: Tsutomu Imoto, Kanagawa (JP)

(73) Assignee: Sony Corporation, Tokyo (JP)

(*) Notice: Subject to any disclaimer, the term of this patent is extended or adjusted under 35 U.S.C. 154(b) by 60 days.

(21) Appl. No.: 10/689,305

(22) Filed: Oct. 20, 2003

(65) Prior Publication Data

US 2004/0207045 A1 Oct. 21, 2004

Related U.S. Application Data

(62) Division of application No. 09/862,042, filed on May 21, 2001, now Pat. No. 6,667,538.

(30) Foreign Application Priority Data

May 24, 2000 (JP) .................................... P2000-153445

(51) Int. Cl.[7] ............................................ H01L 21/265
(52) U.S. Cl. ...................... 438/523; 438/522; 438/519
(58) Field of Search ................................. 438/510, 518, 438/519, 522, 523, 527, 530, 533

(56) References Cited

U.S. PATENT DOCUMENTS

| 4,228,450 A | 10/1980 | Anantha et al. |
| 4,298,401 A | 11/1981 | Nuez et al. |

FOREIGN PATENT DOCUMENTS

| JP | 3-53-126875 | 11/1978 |
| JP | 3-54-056777 | 5/1979 |
| JP | 3-57-018354 | 1/1982 |
| JP | 3-61-002361 | 1/1986 |
| JP | 3-62-060252 | 3/1987 |
| JP | 3-62-143478 | 6/1987 |
| JP | 4-01-268049 | 10/1989 |
| JP | 4-03-169063 | 7/1991 |
| JP | 4-04-067666 | 3/1992 |
| JP | 4-05-114699 | 5/1993 |
| JP | 4-05-315547 | 11/1993 |

OTHER PUBLICATIONS

Goto et al., "Two Dimensional Numerical Simulation of Side–Gating Effect in GaAs MESFET's," IEEE, 1990, pp. 1821–1827, vol. 37.

*Primary Examiner*—David A. Zarneke
(74) *Attorney, Agent, or Firm*—Sonnenschein, Nath & Rosenthal LLP

(57) ABSTRACT

Provided is a semiconductor device having a semiconductor resistance element, which is capable of suppressing a variation in characteristics of the semiconductor resistance element due to an acceptor concentration difficult to be controlled, thereby stably improving the yield of a semiconductor integrated circuit using the semiconductor device. The device includes an n-type semiconductor resistance region formed in the surface of a compound semiconductor substrate, and a p-type buried region formed between the n-type semiconductor resistance region and a substrate region 21S of the compound semiconductor substrate. An acceptor of the p-type buried region is set to be higher than an acceptor concentration in the substrate region and lower than a doner concentration in the n-type semiconductor resistance region, whereby the effect of the acceptor concentration in the substrate on the semiconductor resistance region can be avoided.

2 Claims, 5 Drawing Sheets

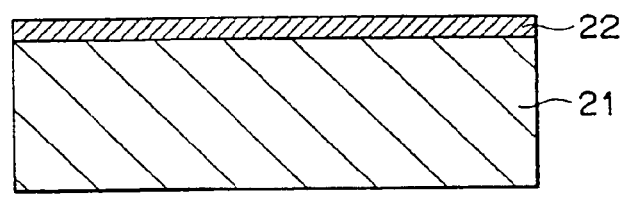
F I G. 1A
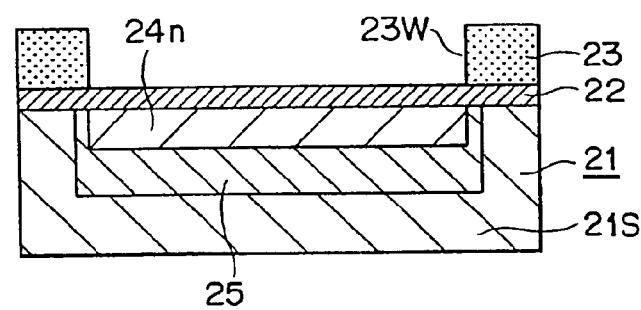
F I G. 1B
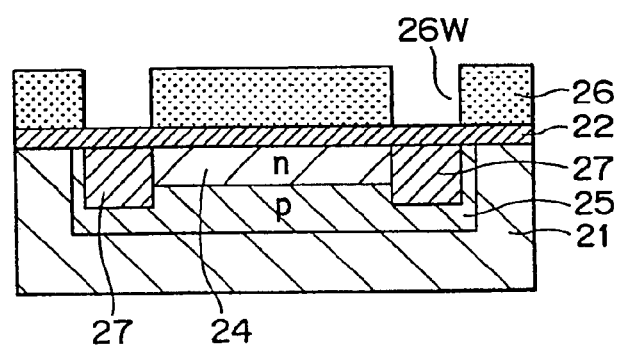
F I G. 1C
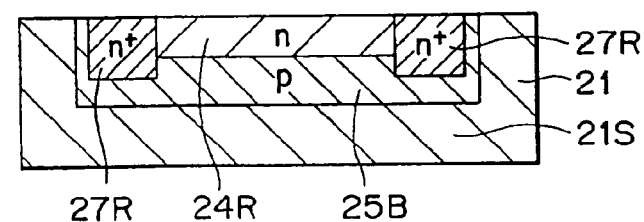
F I G. 1D

PRIOR ART
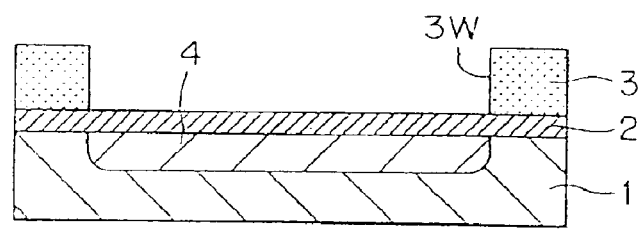
F I G. 3A
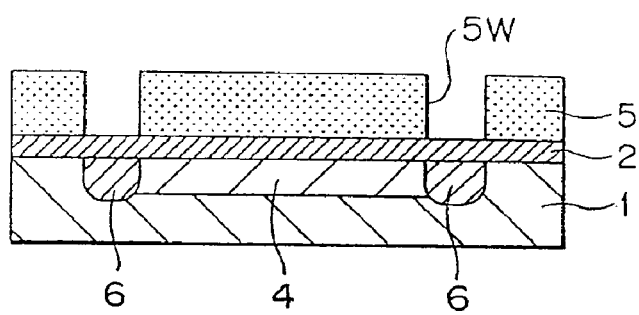
F I G. 3B
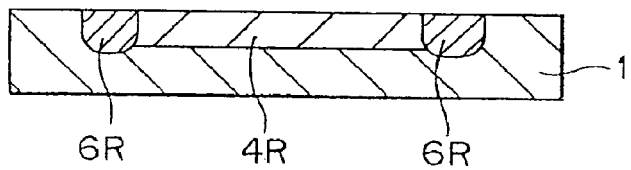
F I G. 3C
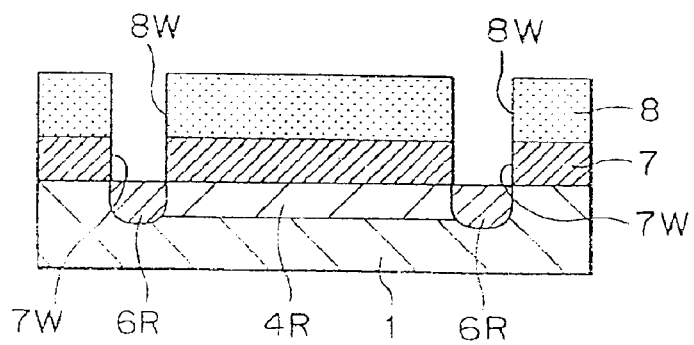
F I G. 3D PRIOR ART
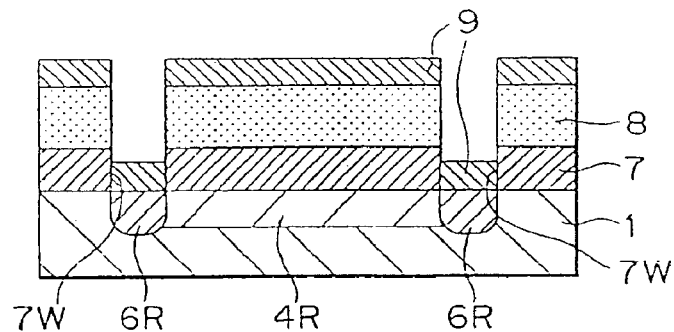
F I G. 4A
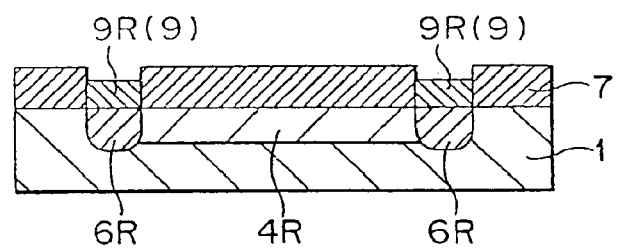
F I G. 4B
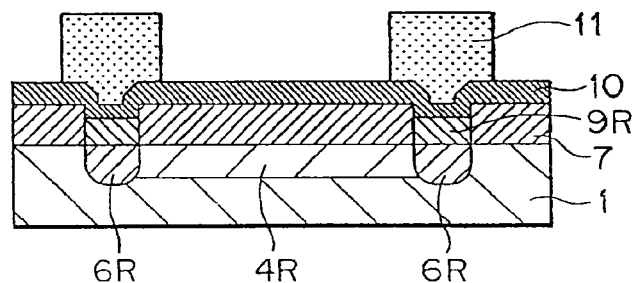
F I G. 4C
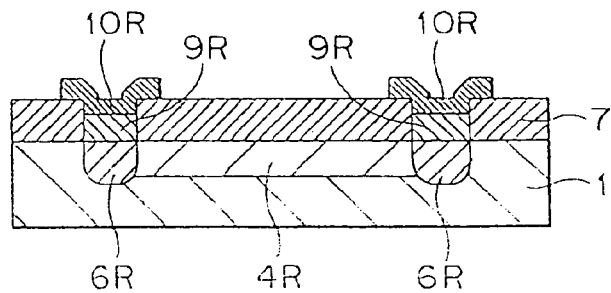
F I G. 4D

METHOD OF FABRICATING SEMICONDUCTOR DEVICE HAVING SEMICONDUCTOR RESISTANCE ELEMENT

RELATED APPLICATION DATA

The present application is a divisional of co-pending U.S. application Ser. No. 09/862,042, filed on May 21, 2001, which claims priority to Japanese Application No. P2000-153445 filed May 24, 2000. Both applications are incorporated herein by reference to the extent permitted by law.

BACKGROUND OF THE INVENTION

The present invention relates to a semiconductor device having a semiconductor resistance element and a fabrication method thereof.

A semiconductor resistance element configured as a semiconductor region formed by doping an impurity in the surface of a semiconductor substrate is one of elements widely used as components of a semiconductor integrated circuit.

A known resistance element is typically formed by doping an n-type impurity in a semi-insulating compound semiconductor substrate, for example, a semi-insulating GaAs substrate at a low impurity concentration. The structure of such a resistance element and a fabrication method thereof will be described below with reference to process diagrams shown in FIGS. 3A to 3D and FIGS. 4A to 4D.

As shown in FIG. 3A, a protective film 2 made from SiN and having a thickness of 50 nm is formed overall on a semi-insulating semiconductor substrate 1 by a plasma CVD (Chemical Vapor Deposition) process. A photoresist layer 3 is once formed overall on the SiN protective film 2, and a portion, positioned over a semiconductor resistance element forming area, of the photoresist layer 3 is removed by photolithography, to form an opening 3w. Ions of Si representative of an n-type impurity are implanted in the surface of the semi-insulating semiconductor substrate 1 through the opening 3W formed in the protective film 2, to form an impurity doped region 4.

As shown in FIG. 3B, the photoresist layer 3 is removed, and a photoresist layer 5 is once formed overall on the protective film 2, and portions, positioned over electrode extraction region forming areas at both ends of the semiconductor resistance element forming area, of the photoresist layer 5 are removed by photolithography, to form two openings 5w.

Ions of Si as the n-type impurity are implanted in the surface of the semi-insulating semiconductor substrate 1 at a high concentration through the openings 5w, to form two high concentration impurity doped regions 6.

As shown in FIG. 3C, the photoresist layer 5 and the surface protective layer 2 are removed, and then the semi-insulating semiconductor substrate 1 is annealed in an arsine atmosphere, to activate ions of Si in the impurity doped regions 4 and 6. As a result, a semiconductor resistance region 4R having a specific resistivity is formed from the region 4, and electrode extraction regions 6R each having a specific low resistivity are formed from the regions 6.

As shown in FIG. 3D, an insulating layer 7 made from SiN and having a thickness of 300 nm is once formed, by the plasma CVD process, overall on the surface of the semi-insulating semiconductor substrate 1 in which the regions 4R and 6R have been formed. A photoresist layer 8 is formed on the insulating layer 7, and two openings 8w are formed in the photoresist layer 8 at positions over the electrode extraction regions 6R. Portions, positioned over the electrode extraction regions 6R, of the insulating layer 7 are removed by reactive ion etching through the openings 8w, to form two electrode contact windows 7w.

As shown in FIG. 4A, an electrode metal layer 9 is formed overall on the photoresist layer 8 in such a manner as to be in contact with the electrode extraction regions 6R exposed to the outside through the contact windows 7w. The electrode metal layer 9 is formed by sequentially forming an AuGe layer having a thickness of 150 nm and a Ni layer having a thickness of 50 nm by a vapor-deposition process.

As shown in FIG. 4B, the portion, on the photoresist layer 8, of the metal layer 9 is selectively removed by a lift-off process, that is, by removing the photoresist layer 8, whereby only portions, on the electrode extraction regions 6R, of the metal layer 9 remain. The substrate 1 is then heated in a forming gas at about 450, to form a pair of electrodes 9R by the metal layer 9 being in ohmic contact with the electrode extraction regions 6R.

As shown in FIG. 4C, a wiring metal layer 10 for forming wiring is formed overall on the insulating layer 7. The wiring metal layer 10 is formed by sequentially forming a Ti layer having a thickness of 50 nm, a Pt layer having a thickness of 50 nm, and an Au layer having a thickness of 200 nm by the vapor-deposition process. A photoresist layer 11 is formed on the wiring metal layer 10, and is patterned by photolithography in such a manner as to remove portions, other than wiring forming areas, of the photoresist layer 11 while leaving the wiring forming areas of the photoresist layer 11.

As shown in FIG. 4D, the wiring metal layer 10 is etched by an ion-milling process using the patterned photoresist layer 11 as a mask, to form wiring portions 10R being in ohmic-contact with the electrodes 9R.

In this way, a semiconductor device having a semiconductor resistance element 12 is formed. With this structure of the semiconductor device, the resistance of the semiconductor resistance element 12 can be set to a desired value by suitably selecting an accelerating voltage applied to Si atoms and the dose of the Si atoms in ion implantation of Si for forming the semiconductor resistance region 4R.

Such a resistance element can be fabricated at a low cost; however, it has a problem that if the impurity concentration in the semiconductor resistance region 4R is reduced for ensuring a high sheet resistance of the region 4R, an electric resistance of the region 4R largely varies depending on a substrate potential.

The reason for this is due to one form of a so-called back gate effect.

FIG. 6 is a graph showing one example of measuring the back gate effect exerted on a current-voltage characteristic of a semiconductor resistance element configured as a n-type semiconductor resistance region 4R formed in a semi-insulating semiconductor substrate 1 shown in FIG. 5. In this example, measurement is performed by changing a substrate potential $V_{sub}$ in a range of −6V to 0 V.

The substrate potential is, as shown in FIG. 5, applied from a substrate electrode 13 provided at a position apart from the semiconductor resistance region 4R formed in the substrate 1.

As is apparent from the data shown in FIG. 6, as the substrate potential $V_{sub}$ becomes smaller on the negative side, an electric resistance of the semiconductor resistance region 4R becomes larger and thereby a saturated current flowing in the semiconductor resistance region 4R becomes smaller. The reason for this may be considered to be due to the fact that a spatial charge layer between the semiconductor resistance region 4R and the semi-insulating substrate region of the substrate 1 be spread to the semiconductor resistance region 4R side by the substrate potential $V_{sub}$ to reduce a sheet carrier concentration in the semiconductor resistance region 4R.

Even when such a back gate effect emerges, if the strength of the back gate effect is stabilized, the circuit can be designed in consideration of the back gate effect.

In the real process, however, the strength of the back gate effect may be often unstable. The reason for this may be considered to be due to the fact that an effective acceptor concentration around the resistance layer varies depending on factors associated with the substrate or process (see N. Goto, et al., "Two Dimensional Numerical Simulation of Side-Gating Effect in GaAs MESFET's", IEEE ED-17, No. 8, 1990).

Accordingly, to fabricate circuits using such resistance elements at a high yield, the above-described effective acceptor concentration must be controlled to be usually kept constant.

However, since the derivation of such an acceptor is not necessarily clear, it is not easy to control the acceptor concentration.

SUMMARY OF THE INVENTION

An object of the present invention is to provide a semiconductor device having a semiconductor resistance element, which is capable of suppressing a variation in characteristics of the semiconductor resistance element due to an acceptor concentration in a substrate region difficult to be controlled as described above, and stably improving the fabrication yield of a semiconductor integrated circuit using the semiconductor device, and a fabrication method thereof.

According to the present invention, there is provided a semiconductor device having a semiconductor resistance element including an n-type semiconductor resistance region formed in the surface of a compound semiconductor substrate, and a p-type buried region provided between the n-type semiconductor resistance region and a substrate region of the compound semiconductor substrate.

In this configuration, preferably, an acceptor concentration in the p-type buried region is selected to be higher than an acceptor concentration in the substrate region and to be lower than a doner concentration in the n-type semiconductor resistance region.

According to the present invention, there is also provided a method of fabricating a semiconductor device having a semiconductor resistance element, including: a step of doping an n-type impurity in a selected region in the surface of a semi-insulating compound semiconductor substrate via a first mask layer formed on the surface of the compound semiconductor substrate, to form an n-type impurity doped region; a step of doping, after or before the step of forming the n-type impurity doped region, a p-type impurity in the surface of the compound semiconductor substrate via a second mask layer formed on the surface of the compound semiconductor substrate, to form a p-type impurity doped region; a step of heat-treating the compound semiconductor substrate, to activate the impurities in the n-type impurity doped region and the p-type impurity doped region, thereby forming an n-type semiconductor resistance region, and also forming a p-type buried region between the n-type semiconductor resistance region and a substrate region of the semiconductor substrate in such a manner as to bring the p-type buried region into contact with the n-type semiconductor resistance region; and a step of forming ohmic electrodes in the semiconductor resistance region.

In this fabrication method, preferably, one mask layer is commonly used as the first and second mask layers.

With this configuration, the p-type buried region is provided between the n-type semiconductor resistance region and the substrate region, and accordingly, by suitably selecting the impurity concentrations of the n-type semiconductor resistance region and the p-type buried region, it is possible to suppress the back gate effect due to a variation in effective concentration of an acceptor present in the substrate region, and the spread of a depletion layer toward the semiconductor resistance region and a variation in the depletion layer toward the semiconductor resistance region.

As described above, according to the semiconductor device having a semiconductor resistance element, since the impurity concentration in the semiconductor resistance element can be increased, the characteristics thereof can be stabilized, with a result that the semiconductor resistance element with less variation in characteristics due to the back gate effect can be obtained with a high yield.

Since the thickness of the semiconductor resistance region can be reduced, the sheet resistance thereof can be sufficiently increased. Accordingly, the semiconductor resistance element having a large resistance without increasing the length of the resistance region between electrodes can be obtained, so that the occupied area of the resistance region, that is, the resistance element can be reduced, with a result that it is possible to increase the packaging density of a semiconductor integrated circuit including the semiconductor device having the semiconductor resistance element and reduce the size of the semiconductor integrated circuit.

Since the semiconductor resistance element with less variation in characteristics due to the back gate effect can be obtained as described above, if the semiconductor device having the semiconductor resistance element is applied to a DCFL (Direct Coupled FET Logic), a transmission delay time and a noise margin thereof can be improved, and if the semiconductor device is applied to a bias circuit with divided resistances, a designed voltage division ratio can be stably obtained.

Since the parasitic capacitance liable to cause deterioration of the frequency characteristic can be prevented as described above, the semiconductor device having the semiconductor resistance element can be desirably applied not only to a logic gate circuit but also to a high frequency circuit.

BRIEF DESCRIPTION OF THE DRAWINGS

FIGS. 1A to 1D are views showing steps of a former half of one embodiment of a method fabricating one embodiment of a semiconductor device according to the present invention.

FIGS. 3A to 3D are views showing steps of a former half of one example of a related art method fabricating a related art semiconductor device.

FIGS. 4A to 4D are views showing steps of a latter half of the example of the related art method fabricating the related art semiconductor device.

DETAILED DESCRIPTION OF THE PREFERRED EMBODIMENTS

Hereinafter, one embodiment of a semiconductor device having a semiconductor resistance element according to the present invention and one embodiment of a fabrication method thereof according to the present invention will be described with reference to FIGS. 1A to 1D and FIGS. 2A to 2D. The present invention, however, should not be construed as limited to these embodiments.

Figure 2A:
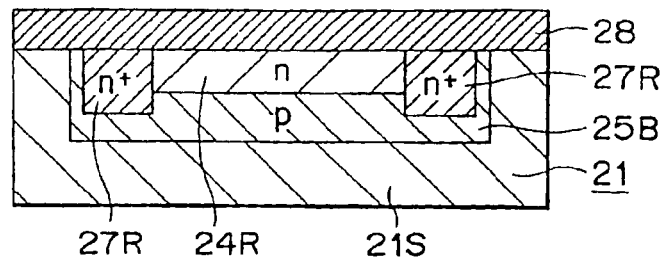
FIGS. 2A to 2D are views showing steps of a latter half of the embodiment of the method fabricating the embodiment of the semiconductor device according to the present invention.
Figure 2B:
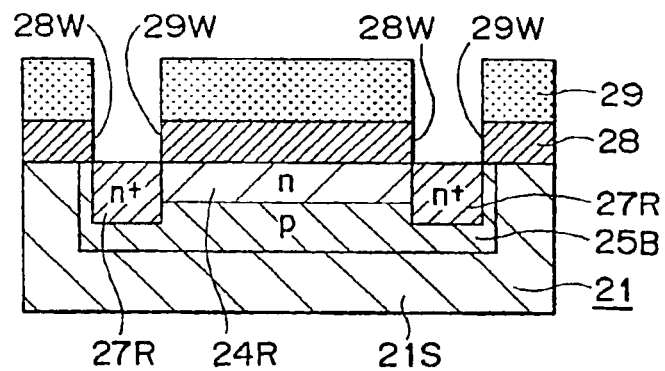
Figure 2C:
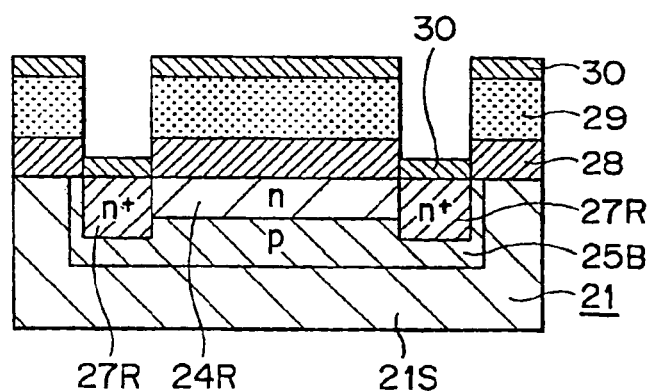
Figure 2D:
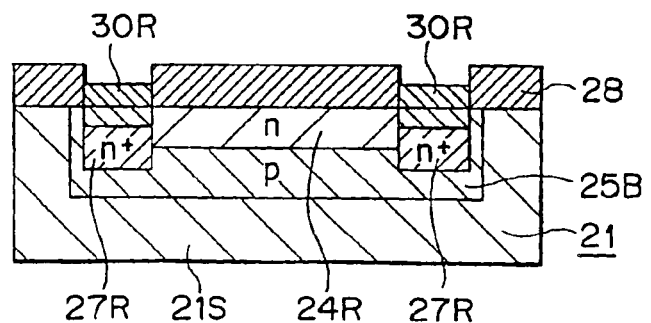

FIG. 2D is a schematic sectional view of a semiconductor resistance element portion of the semiconductor device of the present invention. As shown in this figure, the semiconductor resistance element portion is formed by an n-type semiconductor resistance region 24R having a low impurity concentration and a p-type buried region 25B. The n-type semiconductor resistance region 24R is formed in a selected region in one principal surface of a semi-insulating GaAs compound semiconductor substrate 21. The p-type buried region 25B is formed between the n-type semiconductor resistance region 24R and a substrate region 21S (which is a region where the semiconductor resistance region 24R is not formed) of the semiconductor substrate 21 in such a manner as to surround the semiconductor resistance region 24R and to be in contact with the semiconductor resistance region 24R.

An acceptor concentration in the p-type buried region 25B is selected to be higher than an acceptor concentration in the substrate region 21S and to be lower than a doner concentration in the n-type semiconductor resistance region 24R.

The impurity concentration in the p-type buried region is selected, together with the impurity concentration in the semiconductor resistance region 24R, such that the p-type buried region is perfectly depleted.

In this case, first, as shown in FIG. 1A, a semi-insulating GaAs compound semiconductor substrate 21 is prepared, and a protective film 22 is formed on the surface of the substrate 21. The protective film 22 is configured as an SiN dielectric film having a thickness of 300 nm formed by a plasma CVD process.

As shown in FIG. 1B, a first mask layer 23 having an opening 23w positioned over a semiconductor resistance region forming area is formed on the protective film 22. The mask layer 23 is formed of a photoresist layer. That is to say, the overall-surface of the protective film 22 is coated with a photoresist layer, and the opening 23w is formed in the photoresist layer by known photolithography.

Ions of an n-type impurity are implanted in a surface region of the semi-insulating compound semiconductor substrate 21 through the opening 23w of the first mask layer 23 used as an ion implantation mask, to form an n-type impurity doped region 24. Si may be used as the n-type impurity, and in this case, an implantation energy may be selected to 80 keV and a dose may be selected to $5 \times 10^{12}$ cm$^{-2}$.

Subsequently, ions of a p-type impurity are implanted in the surface region of the substrate 21 up to a position deeper than that of the first impurity doped region 24 by commonly using the above first mask layer 23 as a second mask, to form a second impurity doped region 25. Mg may be used as the p-type impurity, and in this case, an implantation energy may be selected to 240 keV and a dose may be selected to $1 \times 10^{12}$ cm$^{-2}$.

As shown in FIG. 1C, the mask layer 23 is removed, and a third mask layer 26 having two openings 26w positioned over electrode forming areas at both ends of the semiconductor resistance region forming area is formed on the protective film 22. The mask layer 26 is formed by coating the protective layer 22 with a photoresist layer and forming the openings 26w in the photoresist layer by photolithography.

Ions of an n-type impurity are implanted in the surface region of the substrate 21 through both the openings 26w of the mask layer 26 used as an ion implantation mask, to form two high concentration impurity doped regions 27. In this ion implantation, like the ion implantation for forming the impurity doped region 24, Si may be used as the n-type impurity, and in this case, an implantation energy may be set to 150 keV and a dose may be set to $3 \times 10^{13}$ cm$^{-2}$.

As shown in FIG. 1D, both the photoresist layer 26 and the protective layer 22 on the substrate 21 are removed. The removal of the protective film 22 made from SiN may be performed by dipping the substrate 21 in a mixed acid (hydrofluoric acid and ammonia fluoride).

The substrate 21 is then annealed, to activate the impurities doped in the regions 24, 25 and 27. As a result, a semiconductor resistance region 24R having a low impurity concentration and a sufficiently high sheet resistivity is formed from the region 24; two electrode extraction regions 27R each having a high impurity concentration are formed, at both ends of the semiconductor resistance region 24R, from the regions 27; and a p-type buried region 25B is formed, between the semiconductor resistance region 24R and the substrate region 21S, from the region 25. To prevent release of As, the annealing is performed in an As containing atmosphere, for example, an AsH$_3$ atmosphere, and the annealing temperature is set to be in a range of 800 to 850.

In this way, according to this embodiment, the p-type buried region 25B having an acceptor concentration, which is lower than a donor concentration in the n-type semiconductor resistance region 24R, for example, $5 \times 10^{16}$ cm$^{-3}$, is formed.

As shown in FIG. 2A, an insulating layer 28 made from SiN is formed overall on the surface of the semi-insulating semiconductor substrate 21. The insulating layer 28 is formed by depositing SiN to a thickness of 300 nm by the plasma CVD process.

As shown in FIG. 2B, a mask layer 29 having two openings 29w positioned over the electrode extraction regions 27R is formed on the insulating layer 28. The mask layer 29 is formed by coating the overall surface of the substrate 21 with a photoresist layer, and forming the openings 29W in the photoresist layer by photolithography.

The insulating layer 28 is etched through the openings 29w of the mask layer 29 used as an etching mask by reactive ion etching using CF$_4$ as a reaction gas, to form openings 28w.

As shown in FIG. 2C, an electrode metal layer 30 is formed overall on the mask layer 29 in such a manner as to be brought into contact with the electrode extraction regions 27 exposed to the outside through the openings 29w and 28w. The electrode metal layer 30 is formed by sequentially forming an AuGe layer having a thickness of 150 nm and an Ni layer having a thickness of 50 nm by a vapor-deposition process.

As shown in FIG. 2D, the portion, on the photoresist layer 29, of the metal layer 30 is removed by a lift-off process, that is, by removing the photoresist layer 29, whereby the portions, on the electrode extraction regions 27R, of the metal layer 30 remain. The substrate 21 is then heated in a forming gas at about 450, to subject the electrode extraction regions 27R to an alloying treatment, whereby a pair of electrodes 30R are formed from the metal layer 30 being in ohmic contact with the electrode extraction regions 27R.

Following the above-described process, the same steps as those described with reference to FIGS. 4C and 4D may be performed as needed, to form metal wiring portions (not shown).

In this way, a semiconductor resistance element 12 can be formed.

Of course, a plurality of semiconductor resistance elements 12 can be simultaneously formed in a common compound semiconductor substrate 21, and further, other circuit elements may be also formed in the compound semiconductor substrate 21, to thus form a semiconductor integrated circuit device.

In the above-described semiconductor resistance element 12, since the buried region 25B, which has an impurity concentration higher than that of the substrate region 21S and lower than that of the semiconductor resistance region 24R, is formed between the semiconductor resistance region 24R and the substrate region 21S, it is possible to suppress the back gate effect due to a variation in effective concentration of an acceptor present in the substrate region and also suppress a variation in spread of a depletion layer toward the semiconductor resistance region, and hence to stabilize the characteristics of the semiconductor resistance region and also reduce the concentration in the semiconductor resistance region 24R and increase the resistance of the semiconductor resistance region 24R.

By selecting the impurity concentration in the p-type buried region, together with the impurity concentration in the semiconductor resistance region 24R so that the p-type buried region is perfectly depleted, it is possible to reduce a parasitic capacitance liable to cause deterioration of the frequency characteristic.

According to the above-described fabrication method of the present invention, since the impurity doped regions 24 and 25 are formed by using the same mask 23, the impurity doped regions 24 and 25, that is, the n-type semiconductor resistance region 24R and the p-type buried region 25B can be formed with a self-alignment positional relationship kept therebetween.

While a preferred embodiment of the invention has been described using specific terms, such description is for illustrative purposes only, and it is to be understood that changes and variations may be made without departing from the spirit or scope of the following claims.

Figure 5:
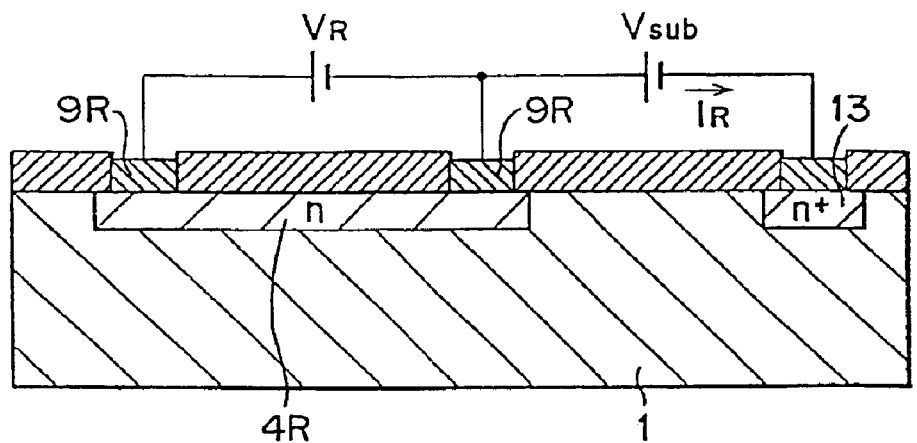
FIG. 5 is a schematic sectional view of a related art semiconductor resistance element.
Figure 6:
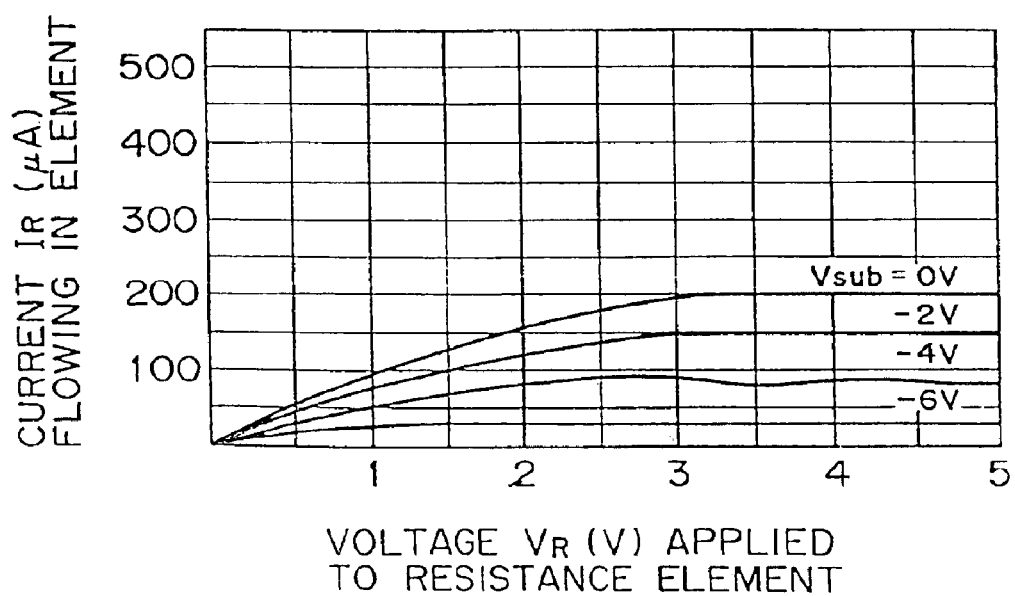
FIG. 6 is a graph showing a current-voltage characteristic of the semiconductor resistance element shown in FIG. 5.

FIGS. 1A to 1D
  Views Showing Fabrication Steps (Part 1)
FIG. 1A
21: compound semiconductor substrate
22: protective film
FIG. 1B
21S: semiconductor substrate region
23: mask layer (commonly used as first and second mask layers)
23w: opening
24: n-type impurity doped region
25: p-type impurity doped region
FIG. 1C
26: third mask layer
26w: opening
27: high concentration impurity doped region
FIG. 1D
24R: n-type semiconductor resistance region
25B: p-type buried region
27R: electrode extraction region
FIGS. 2A to 2D
  Views Showing Fabrication Steps (Part 2)
FIG. 2A
28: insulating layer
FIG. 2B
28w: opening
29: mask layer
29w: opening
FIG. 2C
30: electrode metal layer
FIG. 2D
24R: n-type semiconductor resistance region
25B: substrate
30R: electrode
FIGS. 3A to 3D
  Views Showing Related Art Fabrication Steps (Part 1)
FIG. 3A
1: semi-insulating semiconductor substrate
2: protective film
3: photoresist film
3w: opening
4: impurity doped region
FIG. 3B
4: impurity doped region
5: photoresist layer
5w: opening
6: high concentration impurity doped region
FIG. 3C
4R: semiconductor resistance region
6R: electrode extraction region
FIG. 3D
7: insulating layer
7w: contact window
8: photoresist layer
8w: opening
FIGS. 4A to 4D
  Views Showing Related Art Fabrication Steps (Part 2)
FIG. 4A
1: semi-insulating semiconductor substrate
7: insulating layer
7w: contact window
9: electrode metal layer
FIG. 4B
9R (9): electrode
FIG. 4C
9R: electrode
10: wiring metal layer
11: photoresist layer
FIG. 4D
10R: wiring portion
12: semiconductor resistance element
FIG. 5
13: substrate electrode
FIG. 6
  Current-voltage Characteristic of Resistance Element
  current $I_R$ (A) flowing in element
  voltage $V_R$ (V) applied to resistance element

What is claimed is:

1. A method of fabricating a semiconductor device having a semiconductor resistance element, comprising:

a step of doping an n-type impurity in a selected region in the surface of a semi-insulating compound semiconductor substrate via a first mask layer formed on the surface of the compound semiconductor substrate, to form an n-type impurity doped region;

a step of doping, after or before said step of forming the n-type impurity doped region, a p-type impurity in the surface of said compound semiconductor substrate via a second mask layer formed on the surface of said compound semiconductor substrate, to form a p-type impurity doped region;

a step of heat-treating the compound semiconductor substrate, to activate the impurities in the n-type impurity doped region and the p-type impurity doped region, thereby forming an n-type semiconductor resistance region, and also forming a p-type buried region between the n-type semiconductor resistance region and a substrate region of the semiconductor substrate in such a manner as to bring the p-type buried region into contact with the n-type semiconductor resistance region, wherein an impurity concentration of the p-type buried region is lower than that of the n-type semiconductor resistance region, wherein an impurity concentration of the p-type buried region is lower than that of the n-type semiconductor resistance region and higher than that of the compound semiconductor substrate in order to set a complete depleted state and higher than that of the compound semiconductor substrate in order to set a complete depleted state; and a step of forming ohmic electrodes in the semiconductor resistance region.

2. A method of fabricating a semiconductor device having a semiconductor resistance element according to claim 1, wherein the n-type impurity doped region and the p-type impurity doped region are formed in self-alignment by commonly using one mask layer as the first and second mask layers.

* * * * *